United States Patent [19]

Kamas

[11] Patent Number: 4,922,183
[45] Date of Patent: May 1, 1990

[54] METHODS, SYSTEMS AND APPARATUS FOR DETECTING CHANGES IN VARIABLES

[75] Inventor: Peter Kamas, Sunnyvale, Calif.

[73] Assignee: Raychem Corporation, Menlo Park, Calif.

[21] Appl. No.: 202,278

[22] Filed: Jun. 3, 1988

[51] Int. Cl.⁵ ............................................. G01R 27/02
[52] U.S. Cl. .................................... 324/694; 324/522; 324/539
[58] Field of Search ...................... 324/65 R, 525, 522, 324/541, 539, 66, 540, 512; 379/26

[56] References Cited

U.S. PATENT DOCUMENTS

| | | | |
|---|---|---|---|
| 3,281,673 | 10/1966 | Richardson | 324/525 |
| 3,723,864 | 3/1973 | Ricard | 324/525 |
| 4,418,312 | 11/1983 | Figler et al. | 324/540 |
| 4,446,421 | 5/1984 | Berde | 324/66 X |
| 4,523,187 | 6/1985 | Begg | 324/522 X |
| 4,605,827 | 8/1986 | Chattler | 324/522 X |

FOREIGN PATENT DOCUMENTS 0133748  6/1985  European Pat. Off. .

Primary Examiner—Reinhard J. Eisenzopf
Assistant Examiner—Robert W. Mueller
Attorney, Agent, or Firm—Timothy H. P. Richardson; Herbert G. Burkard

[57] ABSTRACT

A system for detecting a fault, e.g. a liquid leak from a pipe or vessel containing an electrolyte or a hydrocarbon. In one embodiment, the system comprises a central unit and a plurality of sub-units; each of the sub-units is powered in turn from a power source in the central unit, and the sub-unit generates a signal which is observed by the central unit and which identifies the presence of a fault. In another embodiment, signals generated by a detection system at different times are compared and the decision whether to generate a fault alarm is based on that comparison. In another embodiment the system (a) when there is no fault, is a monitoring system which comprises a continuous loop which can be tested to ensure continuity of the system, and which comprises a continuity connection, and (b) when a fault occurs, is a test system in which the location (or other characteristic) of the fault can be determined; there is a constant current source in the continuity connection, and/or the continuity connection is present in the test system as well as the monitoring system and comprises a constant current source in the test system.

12 Claims, 4 Drawing Sheets

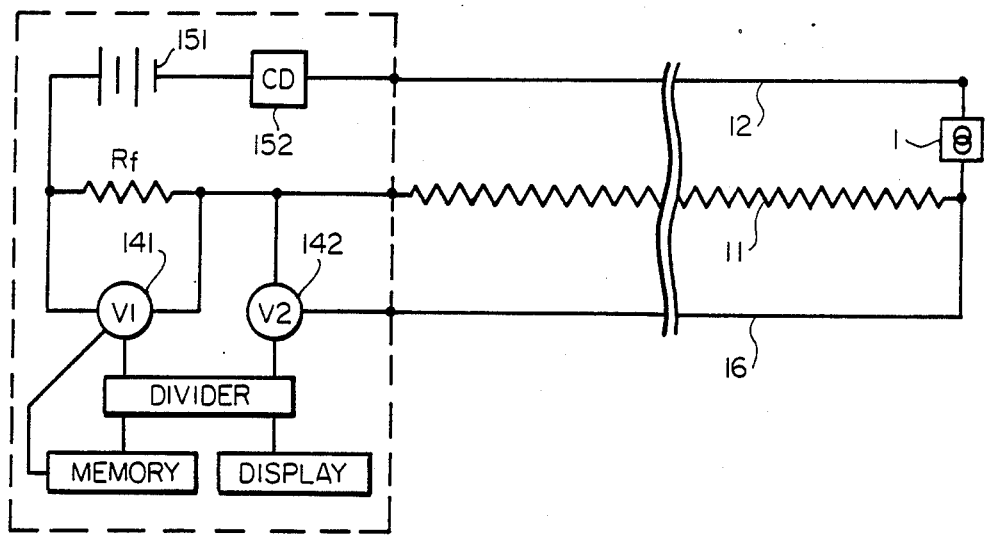
*FIG_1*
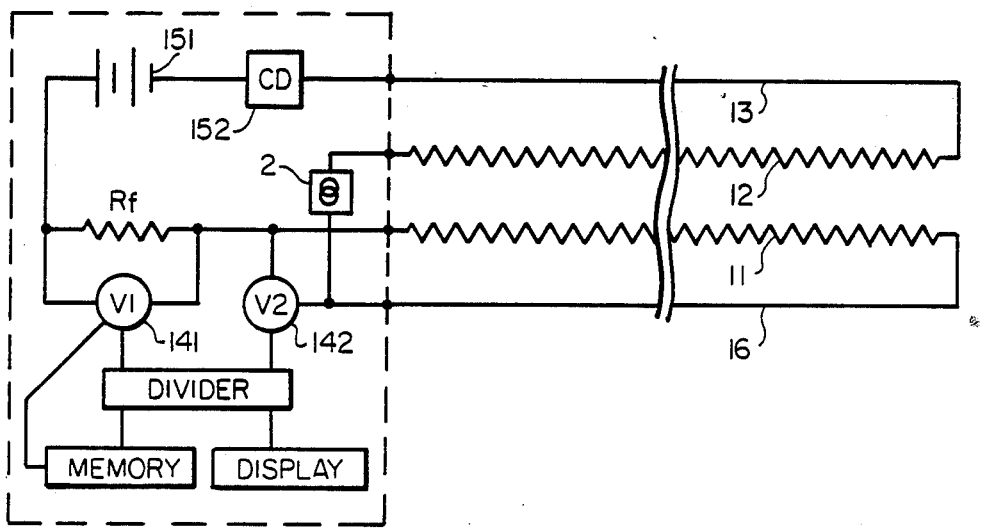
*FIG_2*

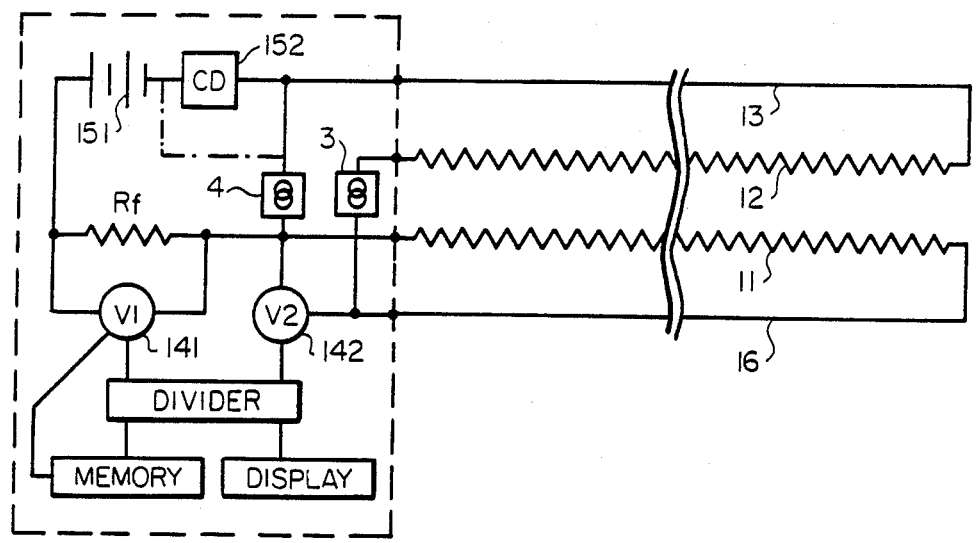
FIG_3
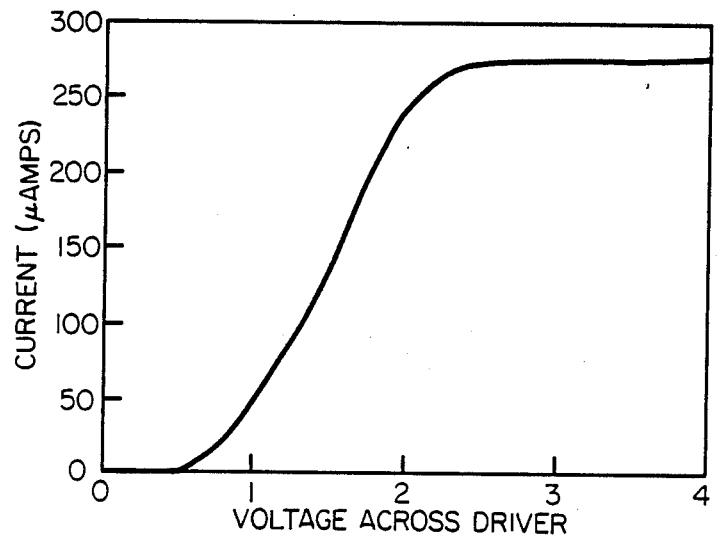
FIG_7

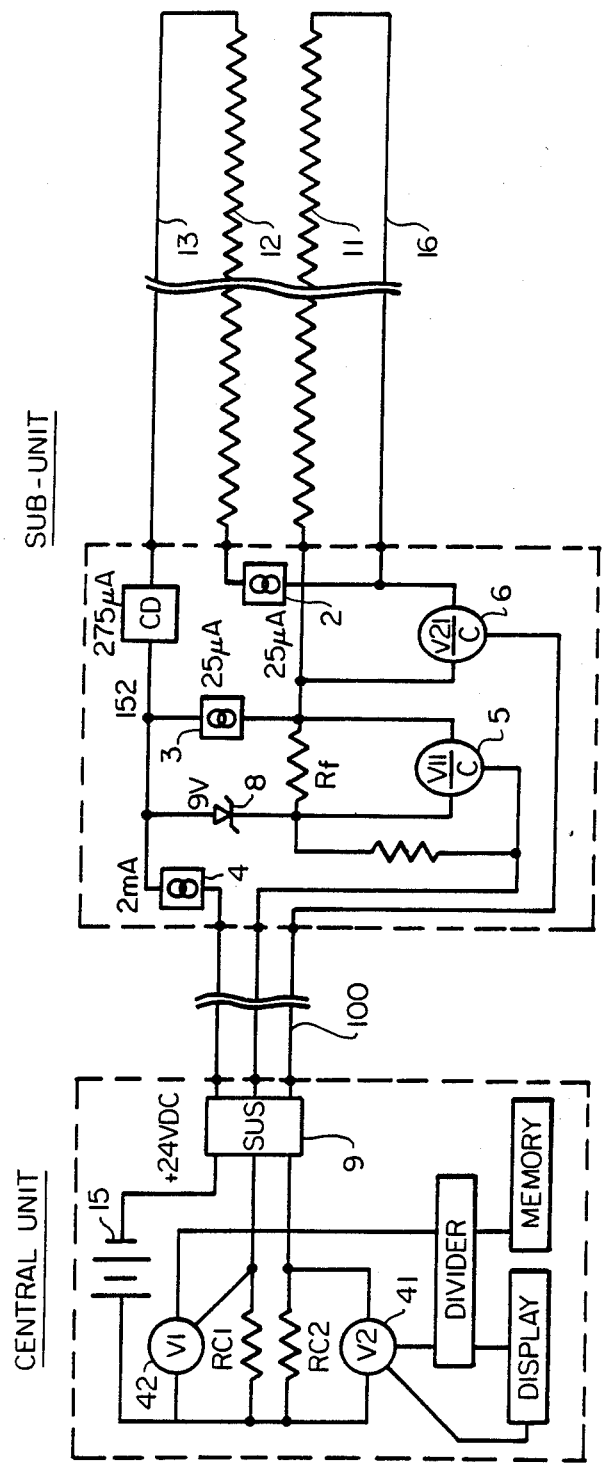
FIG_4

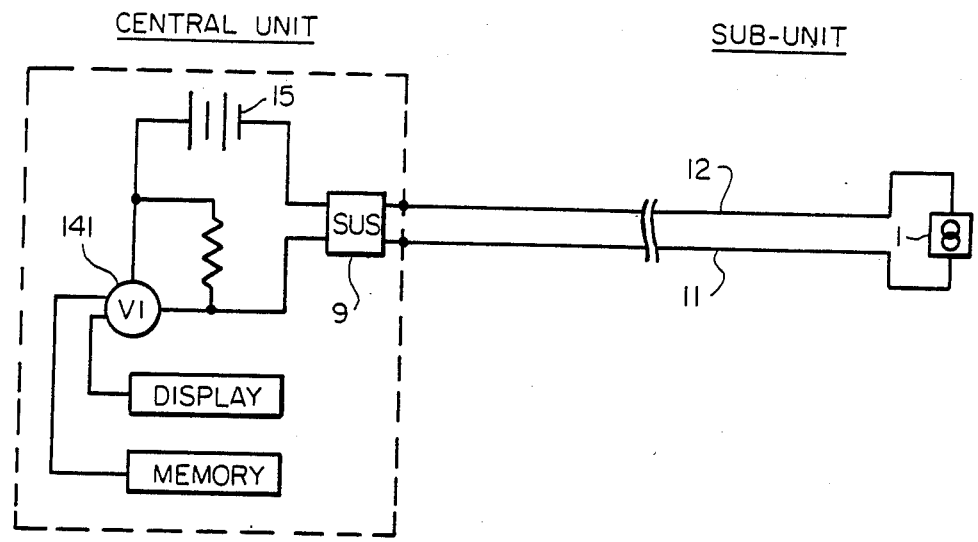
FIG_5
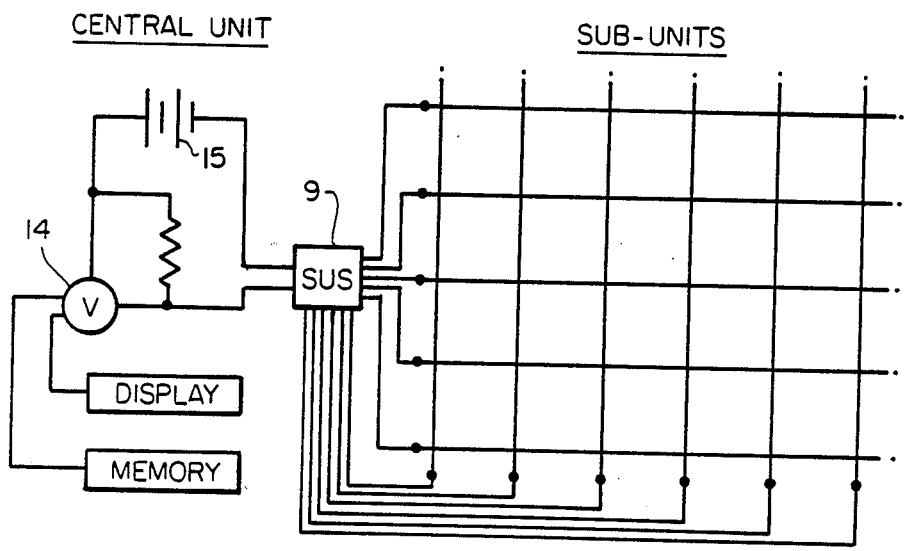
FIG_6

METHODS, SYSTEMS AND APPARATUS FOR DETECTING CHANGES IN VARIABLES

BACKGROUND OF THE INVENTION

1. Field of the Invention

This invention relates to methods, systems and apparatus for detecting, and preferably locating, changes in variables, especially liquid leaks.

2. Introduction to the Invention

A number of methods have been used (or proposed for use) to detect changes in variables along an elongate path, e.g. the occurrence of a leak (of water or another liquid or gas), insufficient or excessive pressure, too high or too low a temperature, the presence or absence of light or another form of electromagnetic radiation, or a change in the physical position of a movable member, e.g. a valve in a chemical process plant or a window in a building fitted with a burglar alarm system. Changes of this kind are referred to in this specification by the generic term "event". Such detection methods are for example highly desirable to detect leaks from steam lines into thermal insulation surrounding such lines, leaks from tanks and pipes containing corrosive or noxious chemicals, or leakage or condensation of water under floors or within telecommunication or electrical power systems. Some of these known methods not only signal when the event takes place, but also indicate the location of the event.

In recent years, substantially improved methods of detecting, and preferably both detecting and locating, events have been proposed and/or introduced into practice by the assignee of this application, Raychem Corporation. Reference may be made for example to copending, commonly assigned Ser. No. 372,179 filed June 27, 1989 which is a file wrapper continuation of Ser. No. 306,237 filed Feb. 2, 1989, now abandoned, which is a file wrapper continuation of Ser. No. 832,562, now abandoned, filed Feb. 20, 1986, by Masia, Reed, Wasley, Reeder, Brooks, Tolles, Frank, Bonomi, McCoy, Hauptly, Stewart, Lahlouh, Welsh, Nyberg and Klingman, and to the applications of which it is a continuation-in-part, namely (1) Ser. No. 599,047 filed Apr. 11, 1984, by Masia and Reed (MP0869-US2), now abandoned, which is a continuation-in-part of Ser. No. 509,897, filed June 30, 1983, by Masia and Reed (MP0869-US1), now abandoned;

(2) Ser. No. 599,048, filed Apr. 11, 1984, by Masia and Reed (MP0869-US3), now abandoned, which is also a continuation-in-part of Ser. No. 509,897, filed June 30, 1983, by Masia and Reed (MP0869-US1), now abandoned;

(3) Ser. No. 556,740, filed Nov. 30, 1983, by Wasley (MP0892-US1), now abandoned;

(4) Ser. No. 556,829, filed Dec. 1, 1983, by Wasley (MP0892-US2), which is a continuation-in-part of Ser. No. 556,740, now abandoned;

(5) Ser. No. 618,106, filed June 7, 1984, by Hauptly (MP0920-US1), now abandoned;

(6) Ser. No. 618,109, filed June 7, 1984, by Reeder (MP0923-US1), now abandoned;

(7) Ser. No. 618,108, filed June 7, 1984, by Brooks and Tolles (MP0924-US2), now abandoned, which is a continuation-in-part of Ser. No. 603,485, filed Apr. 24, 1984, by Brooks and Tolles (MP0924-US1), now abandoned;

(8) Ser. No. 603,484, filed Apr. 24, 1984, by Frank and Bonomi (MP0932-US1), now abandoned;

(9) Ser. No. 691,291, filed Jan. 14, 1985, by McCoy and Hauptly (MP1020-US1), now abandoned;

(10) Ser. No. 809,321, filed Dec. 17, 1985, by McCoy and Hauptly (MP1020-US2, now abandoned, which is a continuation-in-part of Ser. No. 691,291;

(11) Ser. No. 744,170, filed June 12, 1985, by Stewart, Lahlouh and Wasley (MP1072-US1), now abandoned;

(12) Ser. No. 787,278, filed Oct. 15, 1985, by Stewart, Lahlouh, Wasley, Hauptly and Welsh (MP1072-US2), now abandoned, which is a continuation-in-part of Ser. No. 744,170, now abandoned; and,

(13) Ser. No. 831,758, filed Feb. 20, 1986, by Nyberg and Klingman (MP1094-US1), now abandoned.

Other commonly assigned applications to which reference may be made include

Ser. No. 856,925, filed Apr. 28, 1986, by Kamas (MP1121) now abandoned;

Ser. No. 017,375, filed Feb. 20, 1987, by Nyberg and Klingman (MP1094-US3);

Ser. No. 031,481, filed Mar. 27, 1987, by McCoy, Wasley, Wales and Edwards (MP1185); and Ser. No. 057,459, filed June 3, 1987, now U.S. Pat. No. 4,843,321, by Koppitsch and Sparling (MP1197).

Earlier methods for detecting events are disclosed for example in U.S. Pat. Nos. 1,084,910, 2,581,213, 3,248,646, 3,384,493, 3,800,216, 3,991,413, 4,278,931 and 4,400,663, U.K. Pat. Nos. 1,481,850 and 182,339, and German Offenlegungschriften Nos. 3,001,150.0 and 3,225,742. The disclosure of each of these patents is incorporated herein by reference.

SUMMARY OF THE INVENTION

This invention relates to the identification of problems which arise in the detection of events, particularly (but not exclusively) when using the improved systems referred to in the commonly assigned applications referred to above, and to the solution of those problems.

The systems which have hitherto been used for detecting events along an elongate path, in particular systems for detecting and locating a liquid leak, have been stand-alone systems, i.e. each system contains its own power source or is located close to a power source, and the measurements are made and observed at one end of the system. I have developed a centralized system which comprises a central unit and a plurality of sub-units to each of which power can be supplied from the central unit and from each of which signals representing measurements made by the sub-unit can be transmitted to, and observed at, the central unit. In developing this centralized system, I have discovered a number of improvements which are useful not only in the sub-units of a centralized system but also in stand-alone systems.

In its first aspect, the present invention provides a centralized system for detecting an event (1) which comprises
  (a) a central unit which comprises
    (i) a power source (as hereinafter defined),
    (ii) means for observing a current signal, and
    (iii) means for identifiably connecting the central unit to each of a plurality of sub-units;
  and
  (b) a plurality of sub-units, each of which comprises (i) an elongate electrically conductive locating member which extends from a near end to a far end,
(ii) an elongate electrically conductive source member which is adjacent to the locating member and extends from the near end to the far end,
(iii) a voltage-measuring device, and
(iv) a converting device for converting a voltage measured by the voltage-measuring device into a current signal;

and in each of which, sub-units, when an event occurs, an electrical connection is made between the locating member and the source member, and the sub-unit can be powered to provide a test system in which the voltage-measuring device measures the voltage drop across a defined part of the test system, and the converting device converts that voltage drop into a current signal; and (2) in which, when the central unit is connected to a sub-unit, and an event has occured along that sub-unit, power is supplied to the sub-unit from the power source, and the current signal is transmitted from the sub-unit to the central unit and is observed by the central unit.

In detection systems which are useful as sub-units in a centralized system as described above, and in other systems which rely upon the making of an electrical connection between two conductors to trigger a notification system, it is often desirable to use a notification system which will not operate unless the resistance of the connection is within a selected range, usually below a selected threshold level. This is particularly true when the electrical connection is of unknown resistance, for example when the system is designed to detect the presence of an electrolyte, and the electrolyte (when present) provides the connection between the conductors. Thus a water detection system can advantageously comprise a notification system which will not be triggered by small amounts of condensed water vapor, but will be triggered by a leak from a water pipe. In this way, so-called "nuisance tripping" of the system can be avoided.

When the conductors are elongate conductors which are adjacent to each other and which have exposed, but physically separated, conductive surfaces, a problem which has been found to arise frequently is that contamination of the conductors provides high resistance connections between the conductors, giving rise to leakage currents between the conductors. The size of such leakage currents can increase steadily or irregularly the longer the system is in service, or can fluctuate, depending on the source of the contaminants and the effect of ambient conditions on their amount and/or their resistivity. The notification system cannot distinguish between the leakage currents and the currents which result from the occurrence of an event. Consequently, it may be triggered solely by leakage currents which are induced by contamination, or by a combination of such leakage currents and current which flows as a result of an event which gives rise to a connection which has a resistance outside the intended range.

In its second aspect, therefore, the present invention provides a detection system in which contamination-induced leakage currents are monitored and the notification system is adjusted to take account of such leakage currents. Thus in one embodiment, the present invention provides a system for detecting an event along an elongate path having a near end and a far end (A) which comprises
(i) an elongate electrically conductive locating member which extends from the near end to the far end, and which has a first exposed conductive surface;
(ii) an elongate electrically conductive source member which extends from the near end to the far end, which is adjacent to the locating member, and which has a second exposed conductive surface which is physically separated from the first exposed surface at least in the absence of an event;
(iii) means for measuring a quantity which corresponds to the resistance of any connections between the locating and source members along the length thereof,
(iv) means for making a comparison of a function of said quantity as it was measured at different times, and
(v) a notification system which is triggered when a rate of change of a function of said quantity falls within a selected range; and (B) in which, when an event occurs, electrical connection is made between the locating member and the source member, and the system can be powered to provide a test system in which said quantity can be measured and a function of said quantity can be stored, in which a function of said measured quantity can be compared with at least one stored function of said quantity; and the results of said comparison can be used to trigger the notification system.

In detection systems which are useful as sub-units in a centralized system as described above, and in other systems which comprise two or more elongate conductors, it is desirable that the system should be such that the continuity of at least some, and preferably all, of those conductors can be checked. This has been achieved in the past by means of systems comprising a continuity connection which has a fixed resistance and which is switched out of the circuit when the system is being used to detect, and/or to obtain information about an event. The need for such switching arises, for example, because a higher current is needed when an event occurs than is desirable merely for checking continuity, and/or because when the resistance of the event-induced connection between the conductors is not known, the currents in the different parts of the system cannot be accurately determined if there is any other substantial current path between those conductors. The system can be such that the switch is automatically operated when an event occurs (making use of the fact that the event causes an electrical connection between the conductors, thus changing the size of the current in different parts of the system, which is in turn used to operate the switch). Nevertheless, switching is inconvenient and adds expense. I have recognized that various advantages can be obtained by making use of a continuity connection which comprises a constant current source or a like component the current through which, in the monitoring system or in the test system, or both, is known with a sufficient degree of accuracy to enable the event to be detected and, if desired, located, with the desired degree of accuracy The constant current source (or the like) can be present only when continuity is being monitored (i.e. it can be switched out when the system is being used to detect and/or to obtain information about an event), or it can be part of a permanent continuity connection, or it can be present only when the system is being used to detect and/or to obtain information about an event; in the latter case, the constant current source can be switched into the system upon occurrence of an event or it can be a component which is part of a permanent continuity connection and which operates as a constant current source only upon occurrence of an event.

In its third aspect, therefore, this invention provides an elongate detection system in which, in the presence or in the absence of an event, or both, there is a continuity loop which includes (i) the entire lengths of at least two elongate conductors which form part of the system, and (ii) a constant current source (or the like). Thus the invention, in this aspect, includes a system for detecting an event along an elongate path having a near end and a far end (A) which comprises
  (i) an elongate electrically conductive locating member which extends from the near end to the far end, and
  (ii) an elongate electrically conductive source member which extends from the near end to the far end and which is adjacent to the locating member,
(B) in which, in the absence of an event, the system can be powered to provide a monitoring system which comprises a continuous loop which includes (a) the entire lengths of at least one of the locating member and the source member and of another elongate electrically conductive member which extends from the near end to the far end and (b) a continuity connection, and in which (i) when the continuous loop is free from damage, the current which flows at a predetermined point has a first value, and (ii) when the continuous loop is damaged, any current which flows at said predetermined point has a second value which is different from the first value; and
(C) in which, when an event occurs, a further electrical connection is made between the locating member and the source member, and the system ran be powered to provide a test system in which
  (i) the source and locating members are connected to each other by the further connection, and
  (ii) the current which flows at said predetermined point has a third value which is different from the first value and the second value; and
(D) the continuity connection has at least one of the following characteristics
  (i) it comprises a constant current source in the monitoring system, and
  (ii) it is present in the test system as well as the monitoring system and comprises a constant current source in the test system.

The invention further includes novel methods which make use of systems as defined above to detect events, and novel modules which are useful in the systems defined above. Thus in its fourth aspect, the invention provides a module which is suitable for use as the central unit in the centralized system described above and which comprises
(1) a plurality of sets of terminals, each of which sets can be connected to a cable for connection to a sub-unit for detecting an event, and
(2) means for selectively and identifiably connecting each of said sets of terminals to
(3) apparatus for supplying power to the sub-unit and for obtaining information about the sub-unit. said apparatus comprising
  (a) a power supply for supplying power to the sub-unit,
  (b) means for observing current signals from the sub-unit and for determining a rate of change of said current signals, and
  (c) a notification system which operates when said rate of change falls outside a selected range.

BRIEF DESCRIPTION OF THE DRAWING

The invention is illustrated in the accompanying drawing, in which

FIGS. 1-3 are circuit diagrams of stand-alone systems of the invention,

FIGS. 4 and 5 are circuit diagrams of centralized systems of the invention showing only one of a plurality of sub-units, FIG. 6 is a diagram of a centralized system of the invention, and FIG. 7 is a graph showing the relationship between the current output of a current driver and the voltage across it. DETAILED DESCRIPTION OF THE INVENTION As noted above, this invention is particularly useful in identifying and solving problems which arise in the use of methods and apparatus for detecting events which are described in the commonly assigned applications and patents referred to above. Thus these applications and patents disclose prior event detection systems and parts therefor which can be used as sub-units in systems of the invention as defined above which comprise a central unit and sub-units, or which can be used as parts of systems of the invention as defined above, or which can be modified to provide systems of the invention as defined above. The broad range of the methods and apparatus disclosed in these applications and patents will be apparent from the following examples of those methods and apparatus.

I. A method for monitoring for the occurrence of an event, and for detecting and obtaining information about the event upon its occurrence, which method comprises
  (1) providing a system
    (a) which comprises a power source, a voltage-measuring device, an electrically conductive locating member and an electrically conductive source member, and
    (b) in which, upon occurrence of the event,
    electrical connection is made between the locating member and the source member;
    the connection to the locating member being effective at a first point whose location is defined by at least one characteristic of the event;
    the making of the connection enabling the formation of a test circuit which comprises (a) that part of the locating member which lies between the first point and a second point having a known location on the locating member, (b) the and connection, (c) the power source, the power source causing an electrical current of known size to be transmitted between the first and second points on the locating member; and
    the current and the locating member being such that, by measuring the voltage drop between the first and second points, the spatial relationship between the first and second points can be determined;
(2) monitoring the system continuously or on a schedule to determine when a said connection has been made; and
(3) when it is determined that a said connection has been made, using the voltage-measuring device to determine the voltage drop between the first and second points; and
(4) obtaining information concerning the event from the measurement made in step (3).

In one preferred embodiment of this method,
(1) the locating member comprises a plurality of available connection points and has an impedance $Z_{total}$ between the most widely separated available connection points; and
(2) the test circuit comprises not only
   (a) that part of the locating member between the first point and the second point,
   (b) the connection, and
   (c) the power source,
   but also
   (d) a component which is connected in series with said part (a) and which has an impedance substantially equal to the difference between $Z_{total}$ and the impedance of said part (a).

In a second preferred embodiment of this method,
(1) the test circuit comprises a power source which has an output voltage V volts and which causes an electrical current I amps of known size to be transmitted between the first and second points on the locating member; and
(2) information concerning the event is obtained only when the value of the ration V/I is within a predetermined range.

II. Apparatus which is suitable for use in a method as defined in (I) and which comprises
(1) an elongate electrically conductive locating member which comprises a plurality of available connection points and whose impedance from one end to any of the connection points defines the spatial relationship between that end and that connection point;
(2) an elongate electrically conductive source member;
(3) an event-sensitive connection means which is present at a plurality of predetermined locations and which, upon occurrence of an event, at any of said locations, permits or effects electrical connection between the locating member and the source member at one or more of the connection points, the connection being effective at a first point on the location member which is defined by at least one characteristic of the event;
(4) a voltage-measuring device for determining the voltage drop between the first point and a second point which is at one end of the locating member; and
(5) a power source which is electrically connected to the second point on the locating member and, in the absence of an event, is not otherwise connected to the locating member, so that, when occurrence of an event causes an electrical connection to be made between the locating and source members, this results in the formation of a test circuit which comprises (a) that part of the locating member which lies between the first and second points, (b) the connection, and (c) the power source, and in which test circuit a current of known size is transmitted between the first and second points on the locating member.

In one prefered embodiment of this apparatus
(1) the locating member has an impedance $Z_{total}$ between the most widely separated available connection points; and
(2) the locating member and the source member are such that, when an electrical connection is made between them at any one of the available connection points, the sum of (a) the impedance of the locating member between the first end and the connection point and (b) the impedance of the source member between the second end and the connection point is substantially equal to $Z_{total}$.

Another preferred embodiment of this method is an apparatus for detecting and locating, along a longitudinally extending path having a near end and a far end, a change in an ambient condition from a first state to a second state, which apparatus comprises:
(1) a first elongate electrical connection means which lies along said path and which has a near end at the near end of the path and a far end at the far end of the path;
(2) a second elongate electrical connection means
   (i) which lies along said path and which has a near end at the near end of the path and a far end at the far end of the path, the near end of the second electrical connection means being electrically connected to the near end of the first electrical connection means,
   (ii) which is electrically insulated from the first conductor at all points along the path when said ambient condition is in the first state at all points along the path,
   (iii) which, when said ambient condition changes from the first state to the second state at at least one point along the path, becomes electrically connected to the first electrical connection means at a connection point at which said ambient condition has changed from the first state to the second state, thereby creating a test circuit which includes part of the first electrical connection means and part of the second electrical connection means, and
   (iv) whose impedance from the near end to each point thereon is characteristic of its length from the near end to that point;
(3) a controlled current source which forms part of the test circuit created when said ambient condition changes from the first state to the second state;
(4) a third elongate electrical connection means which has a near end at the near end of the path and a far end at the far end of the path, which is electrically insulated from the first and second connection means between its near end and its far end when said ambient condition is in its first state and when it is in its second state, and which connects the near end and the far end of the second electrical connection means, thus forming a reference circuit; and
(5) a voltage-measuring device which
   (a) forms part of the reference circuit, and
   (b) has a very high input impedance by comparison with the other components of the reference circuit;

the first, second and third connection means being physically secured together, and at least one of the first, second and third connection means having a wrapped configuration;

whereby it is possible to monitor the voltage-measuring device, and when the voltage measured by the voltage-measuring device changes, to measure the change in the voltage and to calculate therefrom the distance between the near end of the second electrical connection means and the connection point.

III. A method for monitoring for the occurrence of an event, and for detecting and obtaining information about the event upon its occurrence, which method comprises
  (1) providing a system which
    (a) comprises a power source, a voltage-measuring device, an electrically conductive locating member and an electrically conductive source member, and
    (b) in which, upon occurrence of the event,
    (A) electrical connection is made between the locating member and the return member;
    the connection to the locating member having a known impedance and being effective at a first point whose location is defined by at least one characteristic of the event;
    the making of the connection resulting in the formation of a test circuit which comprises (a) the connection, (b) that part of the locating member which lies between the first point and a second point having a known location on the locating member, and (c) the voltage-measuring device, the voltage-measuring device having an impedance which is very high by comparison with any unknown part of the impedance of the other components of the test circuit; and
    (B) there is a reference circuit which comprises
      (a) the source member, the source member being electrically connected to the second point on the locating member and to a point on the locating member whose distance from the second point is at least as great as the distance from the second point to the first point, both distances being measured along the locating member, and which is otherwise electrically insulated from the locating member,
      (b) that part of the locating member which lies between the first and second points, and
      (c) the power source, the power source causing an electrical current of known size to be transmitted between the first and second points on the locating member; the current and the locating member being such that, by measuring the voltage drop between the first and second points, the spatial relationship between the first and second points can be determined;
  (2) monitoring the system continuously or on a periodic schedule to determine when a said connection has been made;
  (3) when it is determined that a said connection has been made, using the voltage-measuring device to determine the voltage drop between the first and second points; and
  (4) obtaining information concerning the event from the measurement made in step (3).

IV. Apparatus which is suitable for use in a method as defined in III and which comprises (1) an elongate electrically conductive locating member whose impedance from one end to any point on the locating member defines the spatial relationship between that end and that point;
  (2) an elongate electrically conductive return member;
  (3) an event-sensitive connection means which is present at a plurality of predetermined locations and which, upon occurrence of an event at any of said locations, permits or effects electrical connection between the locating member and the return member, the connection having a known impedance and being effective at a first point on the locating member which is defined by at least one characteristic of the event;
  (4) an electrically conductive source member;
  (5) a voltage-measuring device which is electrically connected to the second point on the locating member and, in the absence of an event, is not otherwise connected to the locating member, so that, when occurrence of an event causes an electrical connection to be made between the locating and return members, this results in the formation of a test circuit which comprises (a) the connection, (b) that part of the locating member which lies between the first and second points, and (c) the voltage-measuring device, the voltage-measuring device having an impedance which is very high by comparison with any unknown part of the impedance of the other components of the reference circuit; and
  (6) a power source which is electrically connected to the second point on the locating member and which, when an event takes place, forms part of a reference circuit which comprises
    (a) at least part of the source member,
    (b) that part of the locating member which lies between the first and second points, and
    (c) the power source,
and in which reference circuit a current of known size is transmitted between the first and second points on the locating member.

V. A method for monitoring for the occurrence of an event along an elongate path, and for detecting the event upon its occurrence, which method comprises
  (1) positioning along the path a sensor cable which comprises a first elongate electrically conductive member comprising a conductive polymer and a second elongate electrically conductive member, the first and second members being insulated from each other in the absence of the event and becoming connected to each other through the conductive polymer upon occurrence of the event, and
  (2) monitoring the cable continuously or on a schedule to determine when a said connection has been made.

VI. An elongate apparatus for use in a method for detecting and locating the presence of an electrolyte, the apparatus comprising
  (1) a first elongate electrical connection means which has a near end and a far end;
  (2) a second elongate electrical connection means
    (i) which has a near end adjacent the near end of the first connection means and a far end adjacent the far end of the first connection means,
    (ii) whose impedance, from the near end to each point thereon, is characteristic of its length from the near end to that point, and (iii) which is electrically insulated from the first connection means between its near end and its far end in the absence of the electrolyte and which, in the presence of the electrolyte, becomes electrically connected to the first connection means at at least one connection point whose distance from the near end of the second connection means is characteristic of the location of the point or points at which the electrolyte is present; and (3) a third elongate electrical connection means which has a near end adjacent the near ends of the first and second connection means and a far end adjacent the far ends of the first and second connection means and which is electrically insulated from said first and second electrical connection means (a) between its near end and its far end in the absence of the electrolyte and (b) at least from its near end to the connection point in the presence of the electrolyte;

at least one of the first, second and third connection means having a wrapped configuration.

VII. A method for monitoring for the occurrence of an event, and for detecting and obtaining information about the event upon its occurrence, which method comprises (1) providing a system
  (a) which comprises an electrically conductive locating member and an electrically conductive second member; the locating member comprising
    (i) a plurality of spaced-apart, discrete impedant components, each of which has substantial impedance, and
    (ii) a plurality of elongate intermediate components, each of which physically separates and electrically connects a pair of impedant components, and
  (b) in which, upon occurrence of the event electrical connection is made between the locating member and the second member;
the connection to the locating member being made at at least one of a plurality of available connection points which lie between the impedant components, and the connection being effective at a first point whose location is defined by at least one characteristic of the event; the making of the connection enabling the formation of a test circuit which comprises that part of the locating member between the first point and a second point on the locating member having a known location, and in which an electrical current of known size is transmitted between the first and second points on the locating member; and the current and the locating member being such that, by measuring the voltage drop between the first and second points, the spatial relationship between the first and second points can be determined;

(2) monitoring the system to determine when a said connection has been made;

(3) when it is determined that a said connection has been made, measuring the voltage drop between the first and second points; and (4) obtaining information concerning the event from the measurement in step (3).

VIII. Apparatus which is suitable for use in a method as defined in VII and which comprises (1) an elongate electrically conductive locating member which comprises (a) a plurality of spaced-apart, discrete impedant components, each of which has substantial impedance, and
  (b) a plurality of elongate intermediate members, each of which physically separates and electrically connects a pair of impedant components;

(2) an elongate electrically conductive second member;

(3) a plurality of event-sensitive connection means which, upon occurrence of an event can effect electrical connection between the locating member and the second member, the connection being made at at least one of a plurality of discrete available connection points which lie between the impedant components, and the connection being effective at a first point on the locating member which is defined by at least one characteristic of the event;

(4) an electrically conductive third member;

(5) a voltage-measuring device for determining the voltage drop between the first point and a second point which is at one end of the locating member; and (6) a power source which is electrically connected to the second point on the locating member and, which, at least when occurrence of an event causes electrical connection to be made between the locating and second members, causes a current of known size to be transmitted between the first and second points on the locating member.

IX. A method for monitoring for the occurrence of an event, and for detecting and obtaining information about the event upon its occurrence, which method comprises (1) providing a system
  (a) which comprises and electrically conductive locating member, an electrically conductive second member, a reference impedance which has a known impedance, and a power source; and
  (b) in which, upon occurrence of the event, electrical connection is made between the locating member and the source member;
    the connection to the locating member being effective at a first point whose location is defined by at least one characteristic of the event; and
    the making of the connection resulting in the formation of a test circuit which comprises (i) the reference impedance and (ii) that part of the locating member between the first point and a second point on the locating member having a known location, and in which an electrical current is transmitted between the first and second points on the locating member and has a known relationship with the current through the reference impedance; and the current, the reference impedance and the locating member being such that, by obtaining a ratio between a first voltage drop across the reference impedance and a second voltage drop between the first and second points on the locating member, the spatial relationship between the first and second points can be determined;

(2) monitoring the system to determine when a said connection has been made;

(3) when it is determined that a said connection has been made, obtaining the ratio of the first and second voltage drops; and
(4) obtaining information concerning the event from the ratio in step (3).

X. Apparatus which is suitable for use in a method as defined in IX and which comprises
(1) an elongate electrically conductive locating member whose impedance from one end to any point on the locating member defines the spatial relationship between that end and that point;
(2) an elongate electrically conductive second member;
(3) an event-sensitive connection means which, upon occurrence of an event, effects electrical connection between the locating member and the second member, the connection being effective at a first point on the locating member which is defined by at least one characteristic of the effect;
(4) an electrically conductive third member;
(5) a reference impedance which has a known impedance and which is connected in series with said locating member;
(6) a power source which, at least when occurrence of an event causes electrical connection to be made between the locating and second members, causes a current to be transmitted (i) between the first point and a second point which is at one end of the locating member, and (ii) through said reference impedance, the size of the current transmitted through the reference impedance having a known relationship with the current transmitted between the first and second points;
(7) a first voltage-measuring device for determining a first voltage drop across said reference impedance,
(8) a second voltage-measuring device for determining a second voltage drop between the first and second points; and
(9) a divider which provides a ratio between said first and second voltage drops.

XI. A sensor cable for detecting the presence of an electrically conductive liquid, which comprises:
two elongate conductors, each conductor having an exposed surface which, when the cable is immersed in the liquid, is contacted by the liquid, and
an insulating member which contacts the conductors and physically separates them in such a way that, at least one of the following conditions is fulfilled
(a) when the cable is immersed in the liquid, the conductors become electrically connected by the liquid along a path which is not a straight line; and
(b) the insulating member has a concave surface and physically separates the conductors in such a way that the conductors become electrically connected by the liquid when the concavity is filled.

XII. A device for detecting an event comprising:
(i) first and second conductive members which, in the absence of an event, are electrically insulated from each other,
(ii) a swellable member which swells upon occurrence of the event, and which has at least one of the following characteristics
(a) on swelling it causes an electrical path to be formed between the conductive members, through the apertures of an apertured separator, and
(b) it is a conductive, bridging member which, upon occurrence of the event, swells into contact with the first and second conductive members and bridges the conductive members whereby an electrical path is formed between the conductive members.

One preferred embodiment of such a device comprises
(i) an elongate support core,
(ii) first and second elongate conductive members helically wrapped around the core,
(iii) a separator in the form of a braid surrounding the first and second conductive members.
(iv) a hollow swellable member, comprising a conductive polymer, surrounding the separator braid. and
(v) a restraining braid surrounding the conductive polymer,
wherein when the swellable member is exposed to the liquid it swells through the apertures of the separator braid, contacts and bridges the first and second conductors and forms an electrical path therebetween.

Another preferred embodiment of such a device comprises
(i) a support core having a uniform cross-section along its length;
(ii) a spacer member;
(iii) a first conductive member;
(iv) a second conductive member which is hollow and surrounds the support core, spacer member and first conductive member; and
(v) a swellable member which swells upon occurrence of an event;
wherein the spacer member projects outwardly from the support core a greater distance than the first conductive member such that in the absence of an event it spaces the first and second conductive members from each other.

XIII. A method of detecting a change in the concentration of a chemical species, comprising passing electrical current through an electrochemical cell comprising:
(i) a power source;
(ii) first and second electrodes connected to the power source,
(iii) a liquid; and
(iv) an ion exchange material positioned in contact with the liquid such that substantially all the electrical current passing through the electrochemical cell to the first electrode passes through the ion exchange material;
the ionic resistance of the ion exchange material being different in the presence of increasing concentrations of the chemical species whereby the magnitude of the current passing through the electrochemical cell depends on the concentration of the chemical species in the liquid.

XIV. A method for monitoring for the occurrence of an event, and for detecting and obtaining information about the event upon its occurrence, which method comprises
(1) providing a system
(a) which comprises an electrically conductive locating member including a plurality of branches; and an electrically conductive second member including a plurality of branches; each of the branches of the locating member being associated with a branch of the source member to form a branch line;
(b) in which, upon occurrence of the event electrical connection is made between a branch of the locating member and the associated branch of second member; and (c) in which at least one of said branch lines is provided with means for remotely isolating that branch line so that occurrence of an event does not result in connection of the locating member and second member;

the connection to the locating member being made at at least one of a plurality of available connection points which lie on the branch lines and the connection being effective at a first point whose location is defined by at least one characteristic of the event;

the making of the connection enabling the formation of a test circuit which comprises that part of the locating member between the first point and a second point on the locating member having a known location, and in which an electrical current of known size is transmitted between the first and second points on the locating member; and the current and the locating member being such that, by measuring the voltage drop between the first and second points, the spatial relationship between the first and second points can be determined;

(2) monitoring the system to determine when a said connection has been made;

(3) when it is determined that a said connection has been made, measuring the voltage drop between the first and second points; and (4) obtaining information concerning the event from the measurement made in step (3).

XV. Apparatus which is suitable for use in a method as defined in XIV and which comprises (1) an elongate electrically conductive locating member which comprises a plurality of branches;

(2) an elongate electrically conductive second member which comprises a plurality of branches, each of which is associated with a branch of the source member to form a branch line;

(3) a plurality of event-sensitive connection means which, upon occurrence of an event can effect electrical connection between a branch of the locating member and the associated branch of the second member, the connection being made at at least one of a plurality of discrete available connection points which lie on the branch lines, and the connection being effective at a first point on the locating member which is defined by at least one characteristic of the event;

(4) an electrically conductive third member;

(5) a voltage-measuring device for determining the voltage drop between the first point and a second point which is at one end of the locating member;

(6) a power source which is electrically connected to the second point on the locating member and, which, at least when occurrence of an event causes electrical connection to be made between the locating and second members, causes a current of known size to be transmitted between the first and second points on the locating member; and (7) at least one remote isolation means which can be associated with a branch line and can be activated from a location remote from that branch line so that occurrence of an event does not result in connection of the locating member and the second member in that branch line.

XVI. A method for monitoring for the occurrence of an event, and for detecting and obtaining information about the event upon its occurrence, which method comprises (1) providing a system
(a) which comprises an electrically conductive locating member comprising a plurality of branches which lie in a plane and which do not cross each other, and an electrically conductive second member comprising a plurality of branches which lie in the same plane, which do not cross each other and which do cross the branches of the locating member; and
(b) in which, upon occurrence of the event electrical connection is made between a branch of the locating member and a branch of the second member;

the connection to the locating and second members being made at at least one of a plurality of available connection points which lie on the branches thereof, and the connection to the locating member being effective at a first point whose location is defined by at least one characteristic of the event;

the making of the connection enabling the formation of a test circuit which comprises that part of the locating member between the first point and a second point on the locating member having a known location, and in which an electrical current of known size is transmitted between the first and second points on the locating member; and the current and the locating member being such that, by measuring the voltage drop between the first and second points, the spatial relationship between the first and second points can be determined;

(2) monitoring the system to determine when a said connection has been made;

(3) when it is determined that a said connection has been made, measuring the voltage drop between the first and second points;

(4) rearranging the system so that the electrical functions of the locating and second members are exchanged, and measuring the voltage drop between the point on the second member to which the connection is made and a second point on the second member having a known location; and (5) obtaining information concerning the event from the measurements made in steps (3) and (4).

XVII. Apparatus which is suitable for use in a method as defined in XVI and which comprises (1) an electrically conductive locating member comprising a plurality of branches which lie in a plane and which do not cross each other; and (2) an electrically conductive second member comprising a plurality of branches which lie in the same plane, which do not cross each other, but which do cross the branches of the locating member; and (3) a plurality of event-sensitive connection means which, upon occurrence of an event can effect electrical connection between the branches of the locating member and the branches of the second member, the connection being made at at least one of a plurality of available connection points which lie on the branches, and the connection being effective at points on the locating member and the second member which are defined by at least one characteristic of the event.

The term "power source" is used herein to include a battery, or a generator, or another primary source of electrical power, or terminals which can be connected to a primary power source. The present invention preferably makes use of direct current, e.g. from a battery or a rectifier; the voltage employed is preferably low, e.g. 24 volts, 12 or 9 volts. A suitable Zener diode (or equivalent) can be used to control the maximum voltage in all or selected parts of the system. For example a 24 volt power source can be used to power a central unit and (in turn) the interconnect cables connecting the central unit to each sub-unit, and a 9 volt Zener diode can be used in each sub-unit. In this way each sub-unit operates under substantially the same conditions, independently of the length of the interconnect cable.

The present invention preferably makes use of systems which not only detect the occurrence of an event, but also locate the event. This is preferably done in one of two ways. The first way makes use of a three or four wire system of the kind described in detail in Ser. No. 832,562, in which the location of the event is calculated from the voltage drop between two points on a locating member having known resistance characteristics and carrying a known current (the term "known current" being used to include a current which is known in terms of the voltage drop which it produces across a known resistor). Such a system can be used either as a stand-alone unit or as a sub-unit of a centralized system. The second way makes use of a plurality of two-wire systems arranged in a suitable grid pattern and connected to a central unit; the location of the event is then indicated by the physical crossing points of the systems in which the event is shown to have occurred. In this specification, the two wires which become connected as the result of an event are referred to as the source and locating members, even though there is no locating function available within the two-wire systems.

Reference is made herein to the elongate members of the detection system having a "near end" and a "far end", since in many cases the members will have one end (the near end) which is physically closer to the power source than the other end (the far end). However, it will be understood that this is not necessarily the case, since the members can be in the form of a loop, and that the primary power source can be at any convenient location. The designations "near end" and "far end" are, therefore, used for ease of understanding and are not to be understood as having any limiting effect.

The term "constant current source" is used herein to denote a component which, under the conditions of operation of the system, will produce a constant current. As those skilled in the art will recognize, such components can be operated in such a way that they do rot produce a constant current.

Where reference is made herein to determining "a rate of change", it is to be understood that the function which is being determined can be a simple or a complex one, depending upon the type of change which the operator of the system regards as significant. For example the function in question can be a first or a second differential and may be required to be over (or under) a specified value for a defined period of time (which may itself vary with the absolute level of current). A number of different comparisons can be made, of the same or of different functions of the quantity as it was measured at two or more times. Similarly, the function of the quantity which is stored can be the quantity itself or any other function thereof, and can be the same as or different from the function which is later used for comparison purposes.

It should be noted that in many cases the different aspects of this invention can be combined, and also that where references are made to preferred or exemplary features of a particular aspect of the invention or to a particular Figure, such references are also applicable, with such modification as may be necessary or appropriate, to other aspects of the invention and to other Figures and combinations thereof.

Referring now to the drawing, FIG. 1 shows a three-wire system for detecting and locating a water leak. The system comprises a source member 12, a locating member 11, a return member 16, a battery 151, a current driver 152, a reference resistor $R_f$ with a first voltmeter 141 over it, and a second voltmeter 142 which measure the voltage drop down the locating member 11; a voltage divider compares the voltages $V_1$ and $V_2$ read by the voltmeters 141 and 142, and the result of that comparison is displayed on a display unit. The locating and source members are conductive polymer coated wires which are adjacent to each other but are physically spaced apart. The locating member comprises a wire of precisely known and relatively high resistance per unit length. The components so far enumerated are conventional. The novel features of FIG. 1 are a continuity connection comprising a constant current source 1 which connects the far ends of the locating and source members, and a memory which is connected to the voltmeter 141 and optionally to the voltage divider and which can store and compare measurements provided by the voltmeter and optionally by the divider. The current driver is a component whose current output varies with the voltage across it in the way generally shown in FIG. 7, though the range of voltage over which the current changes and the size of the final current need not be as shown in FIG. 7.

Typically, the change in the current will take place over a 0.5 to 3 volt range, e.g. a 1 to 2 volt range, which lies between 0 and 4 volts, e.g. between 0.25 and 2.5 volts, with a maximum current within the range of 150 to 400, e.g. 250 to 300, microamps. The output of the constant current source 1 is less than the maximum output of the current driver, e.g. 0.05 to 0.3, preferably 0.07 to 0.15, times the maximum output of the driver. Thus the output of the current source 1 is typically 20 to 75 microamps, e.g. 25 or 50 microamps. Initially, the current which flows in the loop comprising the source and locating members is equal to the output of the current source 1. If any part of the loop is cut, the current falls to zero. If the source and locating members become contaminated, leakage currents between them will slowly increase the current passing through $R_f$. If there is a liquid leak, however, there will be a rapid increase in the current through $R_f$. Thus the memory unit, by comparing one or more functions of successive voltages recorded by the voltmeter $V_1$ at known time intervals, can determine the rate at which the sensor cable is being contaminated and whether there has been a leak, even when the contamination level is high. The voltage divider, by comparing the ratio of $V_1$ and $V_2$, and making due allowance for the contribution of the constant current source, provides the location of the "electrical center" of the contamination (if any) and the leak (if any). If desired, the memory unit can additionally compare one or more functions of successive values of the ratio of $V_1$ to $V_2$ at known intervals, to show how the "electrical center" is changing. It will be seen that a large amount of new information can be ascertained in this way.

As the current between the source and locating members increases, the voltage drop over the current driver increases, and the current output of the current driver increases. Depending upon the net resistance of the connections between the source and locating members, the current may reach the limit set by the driver. However, I have found that the limit is not generally reached and serves merely as a safety factor. Thus the current driver and battery could be replaced by any power source which was associated with a limiting component which would prevent too much current from passing through the system, particularly if there was a low resistance connection between the locating and source members.

The precise nature of the constant current source can be important to the accuracy of the location. If the voltage across the constant current source gets too low (because the connection between their source and locating members is sufficiently low in resistance), it will cease to produce its "constant" current. The constant current source, therefore, preferably has a low compliance voltage, preferably less than 2.5 volts, particularly less than 1.0 volts.

In FIG. 1, as in all the Figures, the dotted lines indicate those parts of the system which can be conveniently preassembled in the form of modules in a manufacturing facility. The modules can then be assembled in situ with appropriate sensor cables and, where needed, interconnect cables.

FIG. 2 makes use of a four-wire, balanced, sensor cable and therefore has a constant current source 2 more conveniently placed at the near end of the system, but is otherwise similar to FIG. 1 and operates in the same way.

FIG. 3 is similar to FIG. 2, but makes use of two constant current sources 3 and 4 which are connected so that the continuity of the system can be checked in two stages. The initial current through $R_f$ is the sum of current sources 3 and 4. If the upper loop, comprising members 12 and 13, is broken, the current through $R_f$ comes only from source 4. If the lower loop, comprising members 11 and 16, is broken, no current flows through $R_f$. In addition to providing an independent continuity check, the use of two current sources can enable additional information to be obtained despite damage to the system. The dot-and-dash line in FIG. 3 shows an alternative connection for current source 4 in which it does not "choke" the current driver.

FIG. 4 shows how a number of systems of the kind shown in FIG. 3 can be combined into a centralized system. The central unit can be identifiable connected to the sub-units (usually to one unit at a time) through a sub-unit-selector (SUS) 9. In each sub-system, the voltmeters 141 and 142 are replaced by voltage-to-current converters 5 and 6, and the voltage divider, display and memory are removed. The current signals generated by converters 5 and 6 are sent back to the central unit by interconnect cable 100, and are there converted back to voltages which are observed by volt-meters 41 and 42. The voltages $V_1$ and $V_2$ observed by the voltmeters 41 and 42 are passed to a divider and a display and optionally to a memory. The voltage $V_1$ is also passed to the memory. The sub-unit is further modified by the introduction of a 9-volt Zener for voltage protection as discussed above, and a constant current source having a relatively high output (e.g. 1–3 milliamps, for example 2 milliamps) which limits the overall current in the sub-unit and also makes it possible to check the continuity of the interconnect cable.

FIG. 5 is similar to FIG. 4 except that it uses a 2-wire sub-unit. It operates in substantially the same way as FIG. 5 except that the current is fed directly to the central unit.

FIG. 6 is a diagram showing how a plurality of 2-wire sub-units are arranged as a grid to provide the location of a liquid leak.

Each of the two-wire sub-units on its own can do no more than report to the central unit when there is a leak at some point along its length, without giving the location of the leak. But since there are a plurality of sub-units arranged in a known grid pattern, the location of a leak can be determined by observing which two (or more) of the two-wire sub-units report leaks at some point along their length.

What is claimed is:
1. A system for detecting a liquid leak
    (1) which comprises
        (a) a central unit which comprises
            (i) a power source,
            (ii) means for observing a current signal, and
            (iii) means for identifiably connecting the central unit to each of a plurality of sub-units; and
        (b) a plurality of sub-units, each of which consumes only power supplied by the power source in the central unit, each of which comprises
            (i) an elongate electrically conductive locating member which extends from a near end to a far end,
            (ii) an elongate electrically conductive source member which is adjacent to the locating member and extends from the near end to the far end,
            (iii) a voltage-measuring device, and
            (iv) a converting device for converting a voltage measured by the voltage-measuring device into a current signal;
        and in each of which, when a liquid leak occurs, an electrical connection is made between the locating member and the source member at the location of the leak, and the sub-unit can be powered from an external power source to provide a test system in which the voltage-measuring device measures the voltage drop across a defined part of the system, and the converting device converts that voltage drop into a current signal;
    and
    (2) in which, when the central unit is connected to a sub-unit, and an event has occured along that sub-unit, power is supplied to the sub-unit from the power source, and the current signal is transmitted from the sub-unit to the central unit and is observed by the central unit.

2. A system according to claim 1 wherein the central unit further comprises
    (iii) means for making a comparison of current signals which are observed from the same sub-unit at different times,
    (iv) a notification system which is triggered only when the current signal is within a range which is selected for each sub-unit, and
    (v) adjustment means for changing said selected range in response to said comparison.

3. A system according to claim 2 wherein each sub-unit, when no event has occurred along the sub-unit, comprises a continuity connection which connects the locating and source members at the near end or the far end, to provide a monitoring system which can be powered from the central unit and in which when the locating and source members are free from damage, current flows through the source member between the near end and the far end, through the continuity connection, and through the locating member between the near end and the far end.

4. A module which is suitable for use as the central unit in a system as claimed in claim 1 and which comprises
   (1) a plurality of sets of terminals, each of which sets can be connected to a cable for connection to a sub-unit for detecting an event, and
   (2) means for selectively and identifiably connecting each of said sets of terminals to
   (3) apparatus for supplying power to the sub-unit and for obtaining information about the sub-unit, said apparatus comprising
      (a) a power supply for supplying power to the sub-unit,
      (b) means for observing current signals from the sub-unit and for making a comparison of said current signals at different times,
      (c) a notification system which is triggered when said current signal falls within a selected range, and
      (d) adjustment means for changing said selected range in response to said comparison.

5. A module according to claim 4 wherein there are three terminals in each set of terminals, one for supplying power to the sub-unit and two for receiving current signals from the sub-unit, and wherein said apparatus comprises means for comparing simultaneous current signals from the sub-unit and thus determining the size of a voltage drop in the sub-unit.

6. A system for detecting an event along an elongate path having a near end and a far end
   (A) which comprises
      (i) an elongate electrically conductive locating member which extends from the near end to the far end, and which has a first exposed conductive surface;
      (ii) an elongate electrically conductive source member which extends from the near end to the far end, which is adjacent to the locating member, and which has a second exposed conductive surface which is physically separated from the first exposed surface at least in the absence of an event;
      (iii) means for measuring a quantity which corresponds to the resistance of any connections between the locating and source members along the length thereof,
      (iv) means for making a comparison of a function of said quantity as it was measured at different times,
      (v) a notification system which is triggered only when said quantity falls within a selected range, and
      (vi) adjustment means for changing said selected range in response to said comparison;
   and
   (B) in which, when an event occurs, electrical connection is made between the locating member and the source member, and the system can be powered to provide a test system in which said quantity can be measured and a function of said quantity can be stored, in which a function of said measured quantity can be compared with at least one stored function of said quantity; and the results of said comparison can be used to change said selected range in the notification system.

7. A system for detecting an event along an elongate path having a near end and a far end
   (A) which comprises
      (i) an elongate electrically conductive locating member which extends from the near end to the far end, and
      (ii) an elongate electrically conductive source member which extends from the near end to the far end and which is adjacent to the locating member,
   (B) in which, in the absence of an event, the system can be powered to provide a monitoring system which comprises part of a continuous loop which includes (a) the entire lengths of at least one of the locating member and the source member and of another elongate electrically conductive member which extends from the near end to the far end and (b) a continuity connection, and in which (i) when the locating and source members are free from damage, the current which flows at a predetermined point has a first value, and (ii) when one or the other of the locating and source members is broken, any current which flows at said predetermined point has a second value which is different from the first value;
   (C) in which, when an event occurs, a further electrical connection is made between the locating member and the source member, and the system can be powered to provide a test system in which
      (i) the source and locating members are connected to each other by the further connection, and
      (ii) the current which flows at said predetermined point has a third value which is different from the first value and the second value;
   and
   (D) the continuity connection has at least one of the following characteristics
      (i) it comprises a constant current source in the monitoring system, and
      (ii) it is present in the test system as well as the monitoring system and comprises a constant current source in the test system.

8. A system according to claim 7 wherein the continuity connection is a permanent connection which comprises a constant current source in the monitoring system and in the test system.

9. A system according to claim 7 wherein the continuity connection connects the locating and source members at the near end or the far end.

10. A system according to claim 9 wherein, in the monitoring system, the locating and source members are insulated from each other except for a single continuity connection.

11. A system according to claim 7 which comprises means for determining the voltage drop over a component through which the current is the same as the current at said predetermined point.

12. A system according to claim 7 wherein
   (i) the further connection to the locating member is effective at a first point on the locating member whose location is defined by at least one characteristic of the event; and
   (ii) in the test system, it is possible to determine the voltage drop down that part of the locating member which lies between the first point and a second point having a known location or the locating member, and to determine from that voltage drop the location of the first point.

* * * * *